(12) United States Patent
Noro et al.

(10) Patent No.: US 7,494,943 B2
(45) Date of Patent: Feb. 24, 2009

(54) METHOD FOR USING FILM FORMATION APPARATUS

(75) Inventors: Naotaka Noro, Nirasaki (JP); Yamato Tonegawa, Kai (JP); Takehiko Fujita, Kai (JP); Norifumi Kimura, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 165 days.

(21) Appl. No.: 11/543,880

(22) Filed: Oct. 6, 2006

(65) Prior Publication Data

US 2007/0093075 A1 Apr. 26, 2007

(30) Foreign Application Priority Data

Oct. 20, 2005 (JP) ............................. 2005-305866

(51) Int. Cl.
*H01L 21/00* (2006.01)

(52) U.S. Cl. .................... 438/905; 438/680; 438/778; 257/E21.17; 257/E21.218; 257/E21.227; 257/E21.311; 257/E21.319

(58) Field of Classification Search ................ 438/30, 438/249, 513, 657, 680, 778, 905
See application file for complete search history.

(56) References Cited

U.S. PATENT DOCUMENTS 6,207,008 B1* 3/2001 Kijiima ................... 156/626.1

2005/0066993 A1* 3/2005 Hasebe et al. ................ 134/1
2006/0042544 A1* 3/2006 Hasebe et al. ............. 118/715
2006/0068598 A1* 3/2006 Okada et al. .............. 438/758
2006/0081182 A1* 4/2006 Okada et al. .............. 118/715

FOREIGN PATENT DOCUMENTS

JP 3-293726 12/1991

* cited by examiner

*Primary Examiner*—David Nhu
(74) *Attorney, Agent, or Firm*—Oblon, Spivak, McClelland, Maier & Neustadt, P.C.

(57) ABSTRACT

In a method for using a film formation apparatus for a semiconductor process, process conditions of a film formation process are determined. The process conditions include a preset film thickness of a thin film to be formed on a target substrate. Further, a timing of performing a cleaning process is determined in accordance with the process conditions. The timing is defined by a threshold concerning a cumulative film thickness of the thin film. The cumulative film thickness does not exceed the threshold where the film formation process is repeated N times (N is a positive integer), but exceeds the threshold where the film formation process is repeated N+1 times. The method includes continuously performing first to Nth processes, each consisting of the film formation process, and performing the cleaning process after the Nth process and before an (N+1)th process consisting of the film formation process.

20 Claims, 6 Drawing Sheets

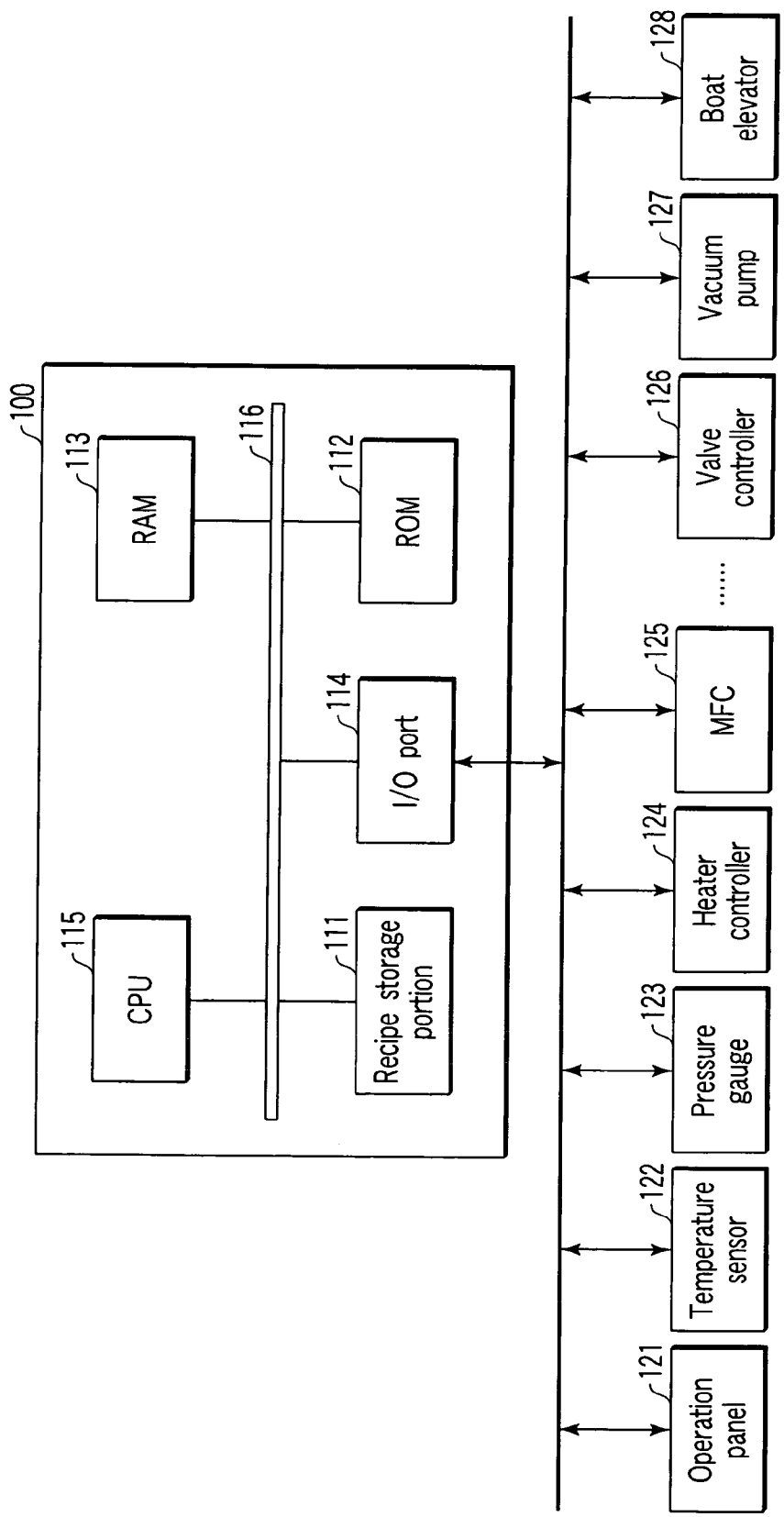
F I G. 2

METHOD FOR USING FILM FORMATION APPARATUS

CROSS-REFERENCE TO RELATED APPLICATIONS

This application is based upon and claims the benefit of priority from prior Japanese Patent Application No. 2005-305866, filed Oct. 20, 2005, the entire contents of which are incorporated herein by reference.

BACKGROUND OF THE INVENTION

1. Field of the Invention

The present invention relates to a film formation apparatus for a semiconductor process for forming a film on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon nitride film, silicon oxide film, poly-crystalline silicon film, on a target substrate, such as a semiconductor wafer. For example, a film formation process of this kind is arranged to form a thin film on a semiconductor wafer, as follows.

At first, the interior of the reaction tube (reaction chamber) of a heat processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure inside the reaction tube is reduced to a predetermined pressure.

Then, while the interior of the reaction tube is kept at the predetermined temperature and pressure (kept exhausted), a film formation gas is supplied through a process gas feed line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafer, but also on, e.g., the inner surface of the reaction tube and other members, the latter being as by-product films. If the film formation process is continued while by-product films are present on the interior of the reaction tube, some of the by-product films separate therefrom and generate particles. These particles may drop onto the semiconductor wafer, and reduce the yield of semiconductor devices to be fabricated.

In order to solve this problem, cleaning of the interior of the reaction tube is performed after the film formation process is repeated several times. In this cleaning, the interior of the reaction tube is heated at a predetermined temperature by a heater, and a cleaning gas, such as a mixture gas of fluorine and a halogen-containing acidic gas, is supplied into the reaction tube. The by-product films deposited on the inner surface of the reaction tube are dry-etched and removed by the cleaning gas. Jpn. Pat. Appln. KOKAI Publication No. 3-293726 discloses a cleaning method of this kind.

In order to suppress particle generation, it is preferable to perform a cleaning process frequently, for example, to clean the interior of a reaction tube every time a thin film is formed on a semiconductor wafer. However, in this case, the downtime of the heat processing apparatus becomes longer, thereby lowering the productivity. Accordingly, it is required to suppress particle generation, while improving the productivity. Further, as described later, the present inventors have found that, when a film formation process is performed after the interior of a reaction tube is subjected to cleaning, a problem may arise in that the film formation rate (deposition rate) is lowered, so the reproducibility of the process is deteriorated.

BRIEF SUMMARY OF THE INVENTION

An object of the present invention is to provide a film formation apparatus for a semiconductor process and a method for using the same, which can suppress particle generation, while improving the reproducibility and productivity of the process.

According to a first aspect of the present invention, there is provided a method for using a film formation apparatus for a semiconductor process, the method comprising:

determining process conditions of a film formation process for forming a thin film on a target substrate accommodated in a reaction chamber of the film formation apparatus, the process conditions including a preset film thickness of the thin film to be formed on the target substrate;

determining a timing of performing a cleaning process for removing a by-product film deposited on an inner surface of the reaction chamber due to the film formation process, in accordance with the process conditions, the timing being defined by a threshold concerning a cumulative film thickness that is a value obtained by multiplying the number of repetitions of the film formation process by the preset film thickness, wherein the cumulative film thickness does not exceed the threshold where the film formation process is repeated N times (N is a positive integer), but exceeds the threshold where the film formation process is repeated N+1 times;

performing first to Nth processes, each consisting of the film formation process, continuously without interposing the cleaning process therebetween; and performing the cleaning process after the Nth process and before an (N+1)th process consisting of the film formation process.

According to a second aspect of the present invention, there is provided a film formation apparatus for a semiconductor process, comprising:

a reaction chamber configured to accommodate a target substrate;

an exhaust system configured to exhaust an interior of the reaction chamber;

a film formation gas supply circuit configured to supply a film formation gas into the reaction chamber, the film formation gas being used for performing a film formation process;

a cleaning gas supply circuit configured to supply a cleaning gas into the reaction chamber, the cleaning gas being used for performing a cleaning process to remove a by-product film deposited on an inner surface of the reaction chamber due to the film formation process; and a control section configured to control an operation of the apparatus, wherein the control section executes recognizing process conditions of the film formation process, the process conditions including a preset film thickness of the thin film to be formed on the target substrate;

determining a timing of performing the cleaning process in accordance with the process conditions, the timing being defined by a threshold concerning a cumulative film thickness that is a value obtained by multiplying the number of repetitions of the film formation process by the preset film thickness, wherein the cumulative film thickness does not exceed the threshold where the film formation process is repeated N times (N is a positive integer), but exceeds the threshold where the film formation process is repeated N+1 times;

performing first to Nth processes, each consisting of the film formation process, continuously without interposing the cleaning process therebetween; and performing the cleaning process after the Nth process and before an (N+1)th process consisting of the film formation process.

According to a third aspect of the present invention, there is provided a computer readable medium containing program instructions for execution on a processor, which, when executed by the processor, cause a film formation apparatus for a semiconductor process to execute recognizing process conditions of a film formation process for forming a thin film on a target substrate accommodated in a reaction chamber of the film formation apparatus, the process conditions including a preset film thickness of the thin film to be formed on the target substrate;

determining a timing of performing a cleaning process for removing a by-product film deposited on an inner surface of the reaction chamber due to the film formation process, in accordance with the process conditions, the timing being defined by a threshold concerning a cumulative film thickness that is a value obtained by multiplying the number of repetitions of the film formation process by the preset film thickness, wherein the cumulative film thickness does not exceed the threshold where the film formation process is repeated N times (N is a positive integer), but exceeds the threshold where the film formation process is repeated N+1 times;

performing first to Nth processes, each consisting of the film formation process, continuously without interposing the cleaning process therebetween; and performing the cleaning process after the Nth process and before an (N+1)th process consisting of the film formation process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a view showing the structure of the control section of the apparatus shown in FIG. 1;

DETAILED DESCRIPTION OF THE INVENTION

Figure 1:
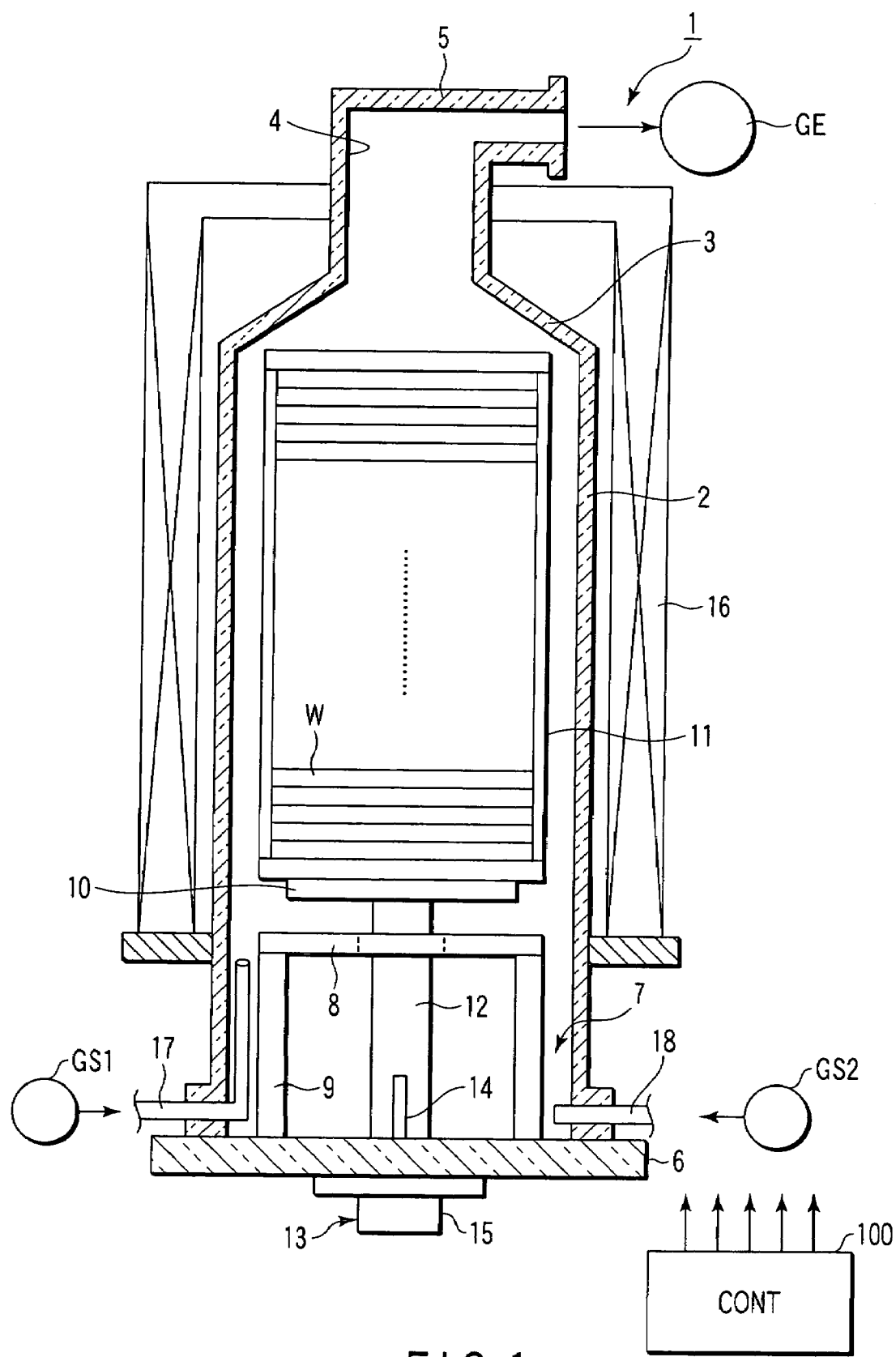
FIG. 1 is a view showing a vertical heat processing apparatus according to an embodiment of the present invention.

In the process of developing the present invention, the inventors studied the decrease in deposition rate and particle contamination after cleaning with regard to conventional methods for cleaning the interior of a reaction tube used in a film formation apparatus for a semiconductor process. As a result, the inventors have arrived at the findings given below.

Specifically, after a film formation process is repeated a plurality of times, the inner surface of a reaction tube may be damaged and suffer cracks formed thereon due to stress generated by by-product films. Particularly, where a film formation process of a silicon nitride film is performed in a quartz reaction tube, by-product films formed by this process apply a relatively large stress on the reaction tube. Consequently, large cracks tend to be easily formed on the inner surface of the reaction tube.

The cracks are exposed on the inner surface of the reaction tube when the by-product films are removed therefrom by cleaning. The cracks on the inner surface of the reaction tube increase the surface area, and may thereby cause the deposition rate to decrease. Further, quartz powder can easily separate and drop from the cracks of the reaction tube and generate particles.

The crack generation on the inner surface of a quartz reaction tube is highly correlated with the crack generation on by-product films formed thereon, such that the number of cracks on the inner surface of the reaction tube is small, as long as the number of cracks on the by-product films is small. Accordingly, where a cleaning process is performed for the interior of the reaction tube before cracks on the by-product films increase, it is possible to prevent the problems described above due to cracks on the inner surface of the reaction tube.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical heat processing apparatus according to an embodiment of the present invention. As shown in FIG. 1, the heat processing apparatus 1 includes an essentially cylindrical reaction tube (reaction chamber) 2 whose longitudinal direction is set in the vertical direction. The reaction tube 2 is made of a heat-resistant and corrosion-resistant material, such as quartz.

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust section GE through an airtight exhaust line 5. The exhaust section GE has a pressure adjusting mechanism including, e.g., a valve and a vacuum exhaust pump. The exhaust section GE is used to exhaust the atmosphere within the reaction tube 2, and set it at a predetermined pressure (vacuum level).

A lid 6 is disposed below the reaction tube 2. The lid 6 is made of a heat-resistant and corrosion-resistant material, such as quartz. The lid 6 is moved up and down by a boat elevator described later (not shown in FIG. 1, but shown in FIG. 2 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermally insulating cylinder 7 is disposed on the lid 6. The thermally insulating cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermally insulating cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of, e.g., 100, semiconductor wafers W at predetermined intervals in the vertical direction. The wafer boat 11 is made of a heat-resistant and corrosion-resistant material, such as quartz. Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as a film formation gas and a cleaning gas) into the reaction tube 2. Each process gas feed line 17 is connected to a process gas supply source GS1 through a mass-flow controller (MFC) described later (not shown in FIG. 1, but shown in FIG. 2 with a reference symbol 125).

For example, as a film formation gas to form a silicon nitride film on the semiconductor wafers W, a mixture gas of dichlorosilane (DCS: $SiH_2Cl_2$) and ammonia ($NH_3$) is used. Alternatively, as a film formation gas to form a silicon nitride film on the semiconductor wafers W, a mixture gas of hexachlorodisilane (HCD: $Si_2Cl_6$) and ammonia ($NH_3$) may be used. Alternatively, for example, as a film formation gas to form a poly-crystalline silicon film on the semiconductor wafers W, mono-silane ($SiH_4$) may be used. For example, as a cleaning gas to remove by-product films deposited inside the reaction tube 2, a gas containing fluorine or chlorine is used. Specifically, a mixture gas of fluorine ($F_2$), hydrogen fluoride (HF), and nitrogen ($N_2$) is used as a cleaning gas.

Although FIG. 1 shows only one process gas feed line 17, a plurality of process gas feed lines 17 are disposed in accordance with gases to be supplied into the reaction tube 2 in the respective process steps, in this embodiment. Specifically, a film formation gas feed line for supplying the film formation gas into the reaction tube 2 and a cleaning gas feed line for supplying the cleaning gas into the reaction tube 2 penetrate the sidewall of the reaction tube 2 near the bottom.

A purge gas feed line 18 also penetrates the sidewall of the reaction tube 2 near the bottom. The purge gas feed line 18 is connected to a purge gas supply source GS2 through an MFC described later (not shown in FIG. 1, but shown in FIG. 2 with a reference symbol 125).

The heat processing apparatus 1 further includes a control section 100 for controlling respective portions of the apparatus. FIG. 2 is a view showing the structure of the control section 100. As shown in FIG. 2, the control section 100 is connected to an operation panel 121, (a group of) temperature sensors 122, (a group of) pressure gages 123, a heater controller 124, MFCs 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. Temperature sensors 122 are configured to measure the temperature at respective portions inside the reaction tube 2 and exhaust line 5, and transmit measurement values to the control section 100. The pressure gages 123 are configured to measure the pressure at respective portions inside the reaction tube 2 and exhaust line 5, and transmit measurement values to the control section 100.

The heater controller 124 is configured to control the heaters 8 and 16. The heater controller 124 turns on the heaters 8 and 16 to generate heat, in accordance with instructions from the control section 100. The heater controller 124 is also configured to measure the power consumption of the heaters 8 and 16, and transmit it to the control section 100.

The MFCs 125 are respectively disposed on piping lines, such as the process gas feed lines 17 and purge gas feed line 18. Each MFC 125 is configured to control the flow rate of a gas flowing through the corresponding line in accordance with instructed values received from the control section 100. Further, each MFC 125 is configured to measure the flow rate of a gas actually flowing, and transmit the reading to the control section 100.

The valve controllers 126 are respectively disposed on piping lines and configured to control the opening rate of valves disposed on piping lines, in accordance with instructed values received from the control section 100. The vacuum pump 127 is connected to the exhaust line 5 and configured to exhaust gas inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the heat processing apparatus 1 is manufactured, only the setup recipe is initially stored. The setup recipe is executed when a thermal model or the like for a specific heat processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a recording medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control an operation of the heat processing apparatus 1, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the reaction tube 2 and exhaust line 5. Further, the CPU 115 outputs control signals, based on measurement data, to the heater controller 124, MFCs 125, valve controllers 126, and vacuum pump 127, to control the respective portions mentioned above in accordance with a process recipe.

In each of the process recipes, process conditions are prescribed for a film formation process and a cleaning process. The film formation process is a process for forming a thin film on semiconductor wafers W, wherein the process comprises a series of steps of loading the semiconductor wafers W into the heat processing apparatus 1, forming the thin film on the semiconductor wafers W, and unloading the semiconductor wafers W with the thin film formed thereon, as described later. The cleaning process is a process for cleaning the interior of the heat processing apparatus 1.

Figure 3:
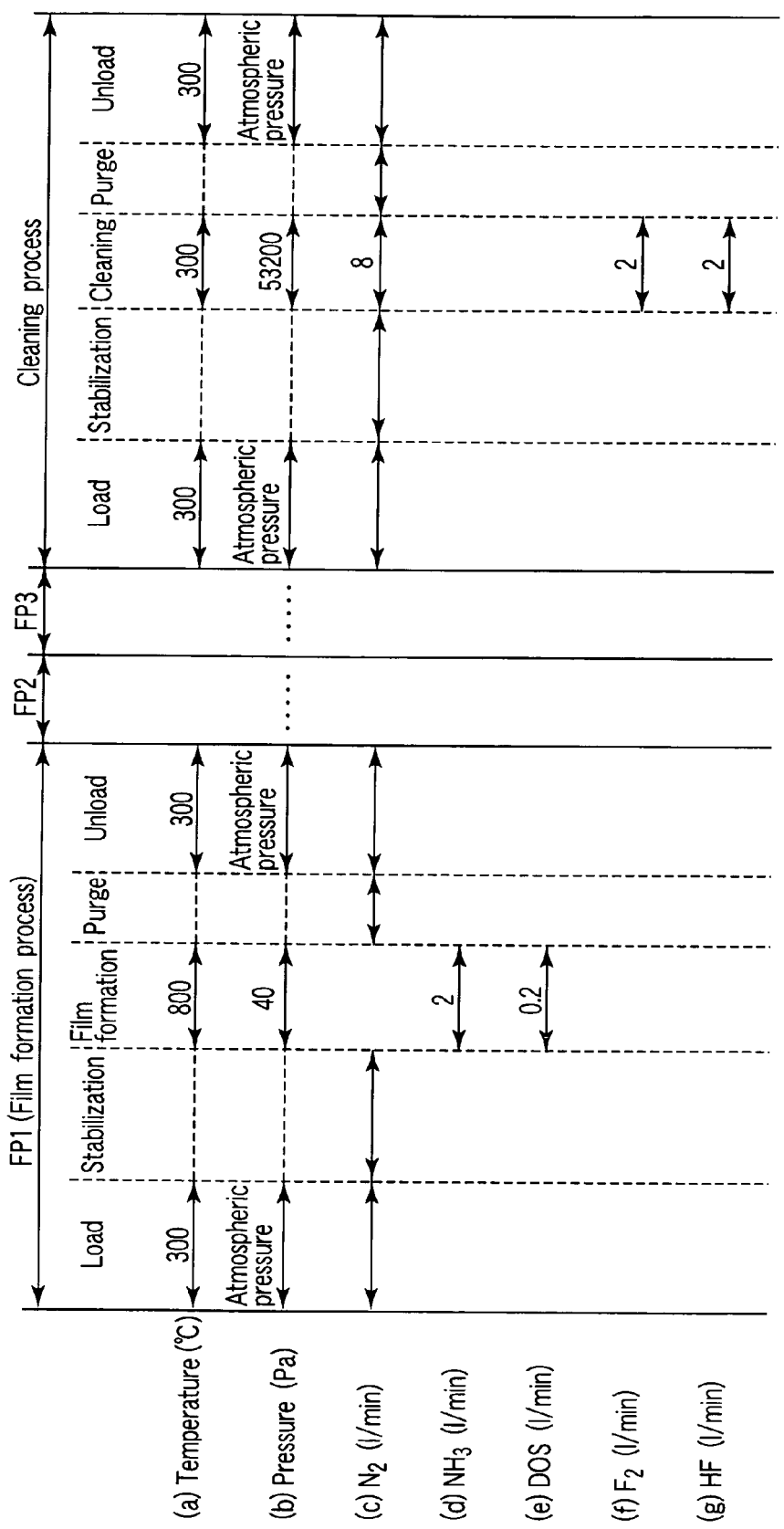
FIG. 3 is a view showing the recipe of a film formation process and a cleaning process according to an embodiment of the present invention.

For example, the conditions of a process recipe are prescribed such that a film formation process is repeated a plurality of times, and then a cleaning process is performed, as shown in FIG. 3. According to an embodiment of the present invention, a cleaning process is performed in a state where the cumulative film thickness of thin films, formed on target substrates by repetition of a film formation process, is less than a predetermined value (threshold), i.e., before the cumulative film thickness exceeds the threshold.

The cumulative film thickness means the total film thickness of thin films formed by repeating a film formation process a plurality of times after the cleaning process. For example, where a film formation process for forming a thin film having a thickness of 0.2 μm on semiconductor wafers W is executed twice, the cumulative film thickness is expressed by 0.2×2=0.4 μm.

The threshold denotes a preset value in accordance with the type of a thin film formed on target substrates, the type of film formation gases, and so forth. If the heat processing apparatus with a condition exceeding the threshold is used to form a thin film on target substrates, by-product films deposited inside the apparatus tend to be cracked (form cracks), and thereby generate particles.

According to a process recipe thus prepared, a cleaning process is performed before the cumulative film thickness of thin films, formed on target substrates by repetition of a film formation process, exceeds the threshold. Consequently, by-product films deposited inside a heat processing apparatus are prevented from being cracked, thereby suppressing particle generation. Further, the film formation process is repeated a plurality of times before one cleaning process, so the productivity is improved. In other words, the productivity can be improved while the particle generation is suppressed.

Next, an explanation will be given of a method for using the heat processing apparatus 1 described above, with reference to FIG. 3. In summary, at first, a silicon nitride film is formed on semiconductor wafers W within the reaction tube 2. Then, by-product films, which contain silicon nitride as the main component (i.e., at 50% or more), deposited inside the reaction tube 2 are removed. FIG. 3 is a view showing the recipe of a film formation process and a cleaning process according to an embodiment of the present invention.

The respective components of the heat processing apparatus 1 described below are operated under the control of the control section 100 (CPU 115). The temperature and pressure inside the reaction tube 2 and the gas flow rates during the processes are set in accordance with the recipe shown in FIG. 3, while the control section 100 (CPU 115) controls the heater controller 124 (for the heaters 8 and 16), MFCs 125 (on the process gas feed line 17 and purge gas feed line 18), valve controllers 126, and vacuum pump 127, as described above.

In the first film formation process (Film formation process FP1), at first, the interior of the reaction tube 2 is heated by the heater 16 at a predetermined load temperature, such as 300° C., as shown in FIG. 3, (a). Further, nitrogen ($N_2$) is supplied through the purge gas feed line 18 into the reaction tube 2 at a predetermined flow rate, as shown in FIG. 3, (c). Then, a wafer boat 11 that holds semiconductor wafers W is placed on the lid 6, and the lid 6 is moved up by the boat elevator 128. Consequently, the wafer boat 11 with the semiconductor wafers W supported thereon is loaded into the reaction tube 2 and the reaction tube 2 is airtightly closed (load step).

Then, nitrogen is supplied through the purge gas feed line 18 into the reaction tube 2 at a predetermined flow rate, as shown in FIG. 3, (c). Further, the interior of the reaction tube 2 is heated by the heater 16 to a predetermined film formation temperature (process temperature), such as 800° C., as shown in FIG. 3, (a). Furthermore, gas inside the reaction tube 2 is exhausted to set the interior of the reaction tube 2 at a predetermined pressure, such as 40 Pa (0.3 Torr), as shown in FIG. 3, (b). The pressure reduction and heating operations are kept performed until the reaction tube 2 is stabilized at the predetermined pressure and temperature (stabilization step).

The motor of the rotation mechanism 13 is controlled to rotate the wafer boat 11 through the rotary table 10. The wafer boat 11 is rotated along with the semiconductor wafers W supported thereon, thereby uniformly heating the semiconductor wafers W.

When the interior of the reaction tube 2 is stabilized at the predetermined pressure and temperature, the supply of nitrogen through the purge gas feed line 18 is stopped. Then, a first film formation gas containing silicon and a second film formation gas containing nitrogen are supplied through the process gas feed line 17 into the reaction tube 2. In this embodiment, the first film formation gas contains DCS supplied at a predetermined flow rate, such as 0.2 liters/min, as shown in FIG. 3, (d). The second film formation gas contains ammonia ($NH_3$) supplied at a predetermined flow rate, such as 2 liters/min, as shown in FIG. 3, (e).

The DCS and ammonia supplied into the reaction tube 2 cause a thermal decomposition reaction, using heat inside the reaction tube 2. The decomposition components produce silicon nitride ($Si_3N_4$), from which a silicon nitride film is formed on the surface of the semiconductor wafers W (film formation step).

When the silicon nitride film formed on the surface of the semiconductor wafers W reaches a predetermined thickness of, e.g., 0.2 µm, the supply of DCS and ammonia through the process gas feed line 17 is stopped. Then, the interior of the reaction tube 2 is exhausted, and nitrogen is supplied through the purge gas feed line 18 at a predetermined flow rate, as shown in FIG. 3, (c). By doing so, the gas inside the reaction tube 2 is exhausted to the exhaust line 5 (purge step). It is preferable to perform cyclic purging by repeating the gas exhaust and nitrogen gas supply for the interior of the process tube 2 a plurality of times, in order to reliably exhaust the gas inside the process tube 2.

Then, the interior of the reaction tube 2 is set by the heater 16 at a predetermined temperature, such as 300° C., as shown in FIG. 3, (a). Further, nitrogen is supplied through the purge gas feed line 18 into the reaction tube 2 at a predetermined flow rate, as shown in FIG. 3, (c). The pressure inside the process tube 2 is thereby returned to atmospheric pressure, as shown in FIG. 3, (b). Then, the lid 6 is moved down by the boat elevator 128, and the wafer boat 11 is thereby unloaded (unload step). Consequently, the first film formation process (film formation process FP1) is completed.

Then, the second film formation process (film formation process FP2) is executed, following the same procedure used in the film formation process FP1. Specifically, the wafer boat 11 that holds new semiconductor wafers W to form a silicon nitride film thereon is loaded into the reaction tube 2 (load step). Then, the stabilization step, film formation step, purge step, and unload step are performed, under the same conditions used in the film formation process FP1. Consequently, a silicon nitride film having a predetermined thickness of, e.g., 0.2 µm, is formed on the surface of the new semiconductor wafers W loaded in the heat processing apparatus 1.

Then, the third film formation process (film formation process FP3) is executed, following the same procedure used in the film formation process FP1. Specifically, the wafer boat 11 that holds new semiconductor wafers W to form a silicon nitride film thereon is loaded into the reaction tube 2 (load step). Then, the stabilization step, film formation step, purge step, and unload step are performed, under the same conditions used in the film formation process FP1. Consequently, a silicon nitride film having a predetermined thickness of, e.g., 0.2 µm, is formed on the surface of the new semiconductor wafers W loaded in the heat processing apparatus 1.

Repeating this film formation process a plurality of times, silicon nitride produced by the film formation process is deposited (adhered) not only on the surface of semiconductor wafers W, but also on the inner surface of the reaction tube 2 and so forth, as by-product films. Accordingly, after the film formation process is repeated a plurality of times, a cleaning process is performed for the heat processing apparatus 1. As shown in FIG. 3, under the conditions used in this film formation process, the cleaning process is performed after the film formation process is executed three times. This is so, because, if the film formation process is executed one more time without interposing the cleaning process (the fourth film formation process is performed), the cumulative film thickness of silicon nitride films formed on semiconductor wafers W reaches a value expressed by 0.2 µm×4=0.8 µm. As described later, in light of the conditions used in this film formation process, the threshold of the cumulative film thickness is set at 0.7 µm. Where the cumulative film thickness exceeds the threshold, by-product films deposited inside the reaction tube 2 tend to be cracked much more, and thereby generate particles.

In the cleaning process, at first, the interior of the reaction tube 2 is maintained by the heater 16 at a predetermined load temperature, such as 300° C., as shown in FIG. 3, (a). Further, nitrogen is supplied through the purge gas feed line 18 into the reaction tube 2 at a predetermined flow rate, as shown in FIG. 3, (c). Then, an empty wafer boat 11 that holds no semiconductor wafers W is placed on the lid 6, and the lid 6 is moved up by the boat elevator 128. Consequently, the wafer boat 11 is loaded into the reaction tube 2 and the reaction tube 2 is airtightly closed (load step).

Then, nitrogen is supplied through the purge gas feed line 18 into the reaction tube 2 at a predetermined flow rate, as shown in FIG. 3, (c). Further, the interior of the reaction tube 2 is heated by the heater 16 at a predetermined cleaning temperature, such as 300° C., as shown in FIG. 3, (a) Furthermore, gas inside the reaction tube 2 is exhausted to set the interior of the reaction tube 2 at a predetermined pressure, such as 53,200 Pa (400 Torr), as shown in FIG. 3, (b). The pressure reduction and heating operations are kept performed until the reaction tube 2 is stabilized at the predetermined pressure and temperature (stabilization step).

When the interior of the reaction tube 2 is stabilized at the predetermined pressure and temperature, the supply of nitrogen through the purge gas feed line 18 is stopped. Then, a cleaning gas is supplied through the process gas feed line 17 into the reaction tube 2. In this embodiment, the cleaning gas contains fluorine ($F_2$) supplied at a predetermined flow rate, such as 2 liters/min, as shown in FIG. 3(f), hydrogen fluoride (HF) supplied at a predetermined flow rate, such as 0.2 liters/min, as shown in FIG. 3, (g), and nitrogen or dilution gas supplied at a predetermined flow rate, such as 8 liters/min, as shown in FIG. 3, (c).

The cleaning gas is heated in the reaction tube 2, and fluorine in the cleaning gas is activated, thereby forming a state in which a number of reactive free atoms are present. The activated fluorine comes into contact with by-product films (containing silicon nitride as the main component) deposited on the inner surface of the reaction tube 2 and so forth. Consequently, the by-product films are etched and removed (cleaning step). In this cleaning step, the temperature inside the reaction tube 2 is preferably maintained at a temperature within a range of from 200° C. to 500° C. Further, the pressure inside the reaction tube 2 is preferably maintained at a pressure within a range of from 13.3 Pa (0.1 Torr) to 53,320 Pa (400 Torr).

When the by-product films deposited inside the reaction tube 2 are removed, the supply of the cleaning gas through the process gas feed line 17 is stopped. Then, the interior of the reaction tube 2 is exhausted, and nitrogen is supplied through the purge gas feed line 18 into the reaction tube 2 at a predetermined flow rate, as shown in FIG. 3, (c). By doing so, the gas inside the reaction tube 2 is exhausted to the exhaust line 5 (purge step). It is preferable to perform cyclic purging by repeating the gas exhaust and nitrogen gas supply for the interior of the process tube 2 a plurality of times, in order to reliably exhaust the gas inside the process tube 2.

Then, the interior of the reaction tube 2 is set by the heater 16 at a predetermined temperature, such as 300° C., as shown in FIG. 3, (a). Further, nitrogen is supplied through the purge gas supply line 18 into the reaction tube 2 at a predetermined flow rate, as shown in FIG. 3, (c). The pressure inside the process tube 2 is thereby returned to atmospheric pressure, as shown in FIG. 3, (b). Then, the lid 6 is moved down by the boat elevator 128, and the wafer boat 11 is thereby unloaded (unload step). Consequently, the cleaning process is completed.

As the process described above is being performed, by-product films deposited on the inner surface of the reaction tube 2, the surface of the wafer boat 11, and so forth are removed. Thereafter, a wafer boat 11 with a new lot of semiconductor wafers W mounted thereon is placed on the lid 6, and the film formation process is started again in the manner described above.

As described above, according to this embodiment, the cleaning process is performed before the cumulative film thickness of silicon nitride films, formed on semiconductor wafers W by repetition of the film formation process, exceeds the threshold (0.7 μm, as described later). Consequently, by-product films deposited inside the heat processing apparatus are prevented from being cracked, thereby suppressing particle generation. Further, the film formation process is repeated three times before one cleaning process, so the productivity is improved. In other words, the productivity can be improved while the particle generation is suppressed.

EXPERIMENT 1

In order to define the timing for performing a cleaning process, based on the threshold of the cumulative film thickness, for a film formation process using DCS and ammonia to form a silicon nitride film, a process was performed under the following conditions. Specifically, while the interior of the reaction tube 2 was set at 800° C. and 40 Pa (0.3 Torr), DCS set at 0.2 liters/min and ammonia set at 2 liters/min were supplied, to form a silicon nitride film on semiconductor wafers W. In this film formation process, a quartz chip having a predetermined size was placed in the reaction tube 2 to facilitate sampling of a by-product film. After each film formation process, visual examination was performed on the surface of the quartz chip with a by-product film deposited thereon (and having a cumulative film thickness) to measure the number of cracks. Specifically, one diagonal line was drawn on the image of the quartz chip including the by-product film, and the number of intersections of the diagonal line with lines (grooves) formed by cracks were counted to quantify the cracks.

Figure 4:
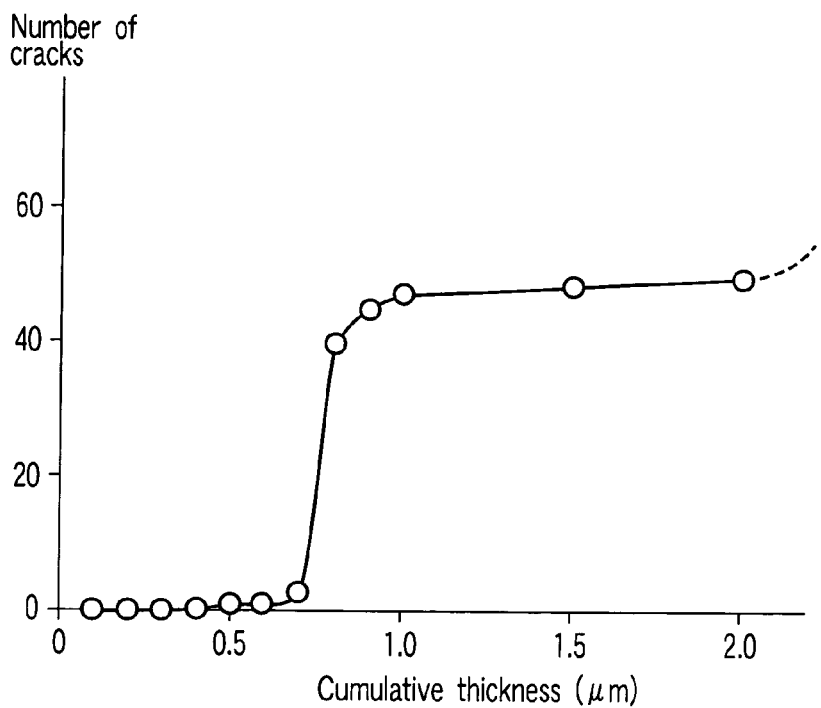
FIG. 4 is a graph showing the relationship between the cumulative film thickness on target substrates and the number of cracks on a by-product film, where a film formation process using DCS and ammonia to form a silicon nitride film having a thickness of 0.1 µm was repeated a plurality of times.
Figure 5:
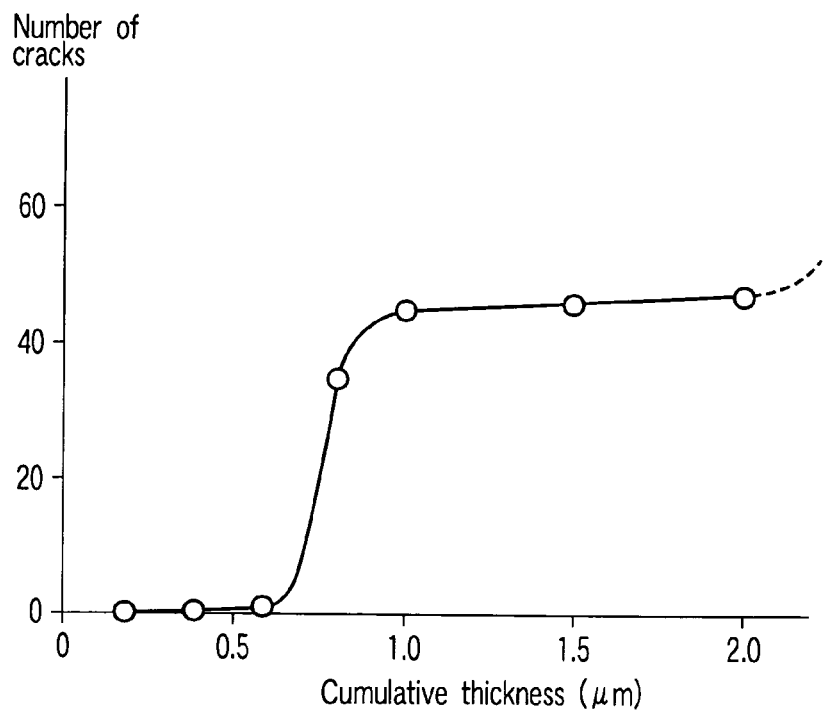
FIG. 5 is a graph showing the relationship between the cumulative film thickness on target substrates and the number of cracks on a by-product film, where a film formation process using DCS and ammonia to form a silicon nitride film having a thickness of 0.2 µm was repeated a plurality of times.

FIG. 4 is a graph showing the relationship between the cumulative film thickness on target substrates and the number of cracks on a by-product film, where a film formation process using the conditions of Experiment 1 to form a silicon nitride film having a thickness of 0.1 μm was repeated a plurality of times. FIG. 5 is a graph showing the relationship between the cumulative film thickness on target substrates and the number of cracks on a by-product film, where a film formation process using the conditions of Experiment 1 to form a silicon nitride film having a thickness of 0.2 μm was repeated a plurality of times.

As shown in FIGS. 4 and 5, where the cumulative film thickness was 0.7 μm or less, cracks were scarcely generated. On the other hand, where the cumulative film thickness exceeded 0.7 μm, a lot of cracks were generated. From these results, it has been found that the threshold of the cumulative film thickness should be set at 0.7 μm, regardless of the preset film thickness of a silicon nitride film formed by one film formation process.

As described above, where DCS and ammonia are used to form a silicon nitride film, the threshold of the cumulative film thickness is set at 0.7 μm. For example, where a silicon nitride film of 0.2 μm is formed on a semiconductor wafer W, as described above, a cleaning process is performed after the film formation process is repeated three times. Alternatively, where a silicon nitride film of 0.1 μm is formed on a semiconductor wafer W, a cleaning process is performed after the film formation process is repeated seven times. Accordingly, each process recipe is prepared in accordance with a set of process conditions.

EXPERIMENT 2

Figure 6:
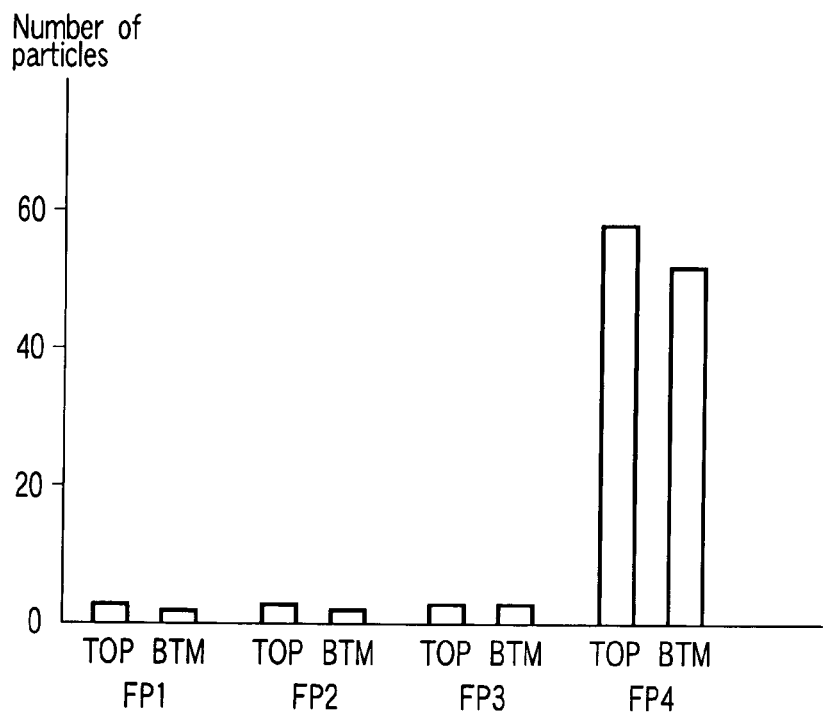
FIG. 6 is a graph showing the number of particles deposited on a silicon nitride film formed by each film formation process.

In relation to the method according to the embodiment described above, silicon nitride films formed by the first to third film formation processes FP1 to FP3 were examined in terms of the number of particles deposited thereon. At this time, the number of particles was confirmed for semiconductor wafers W placed at the top (TOP) and bottom (BTM) of the wafer boat 11. Further, for comparison, a silicon nitride film formed by a fourth film formation process FP4 was also examined in terms of the number of particles deposited thereon. The fourth film formation process FP4 was performed after the third film formation process FP3, without interposing a cleaning process therebetween. FIG. 6 is a graph showing the number of particles deposited on a silicon nitride film formed by each film formation process.

As shown in FIG. 6, the number of particles on the silicon nitride film formed by each of the film formation processes FP1 to FP3 was very small. On the other hand, the number of particles on the silicon nitride film formed by the film formation process FP4 was very large. From these results, it has been confirmed that particle generation within the heat processing apparatus 1 is suppressed by performing a cleaning process before the cumulative film thickness exceeds 0.7 μm (threshold).

EXPERIMENT 3

In order to confirm the dependency of the threshold of the cumulative film thickness relative to the process temperature, process pressure, and process gas flow rate, for a film formation process using DCS and ammonia to form a silicon nitride film, a process was performed under the following conditions. Specifically, while the interior of the reaction tube 2 was set at 600° C. and 133 Pa (1 Torr), DCS set at 0.1 liters/min and ammonia set at 0.5 liters/min were supplied, to form a silicon nitride film on semiconductor wafers W.

Figure 7:
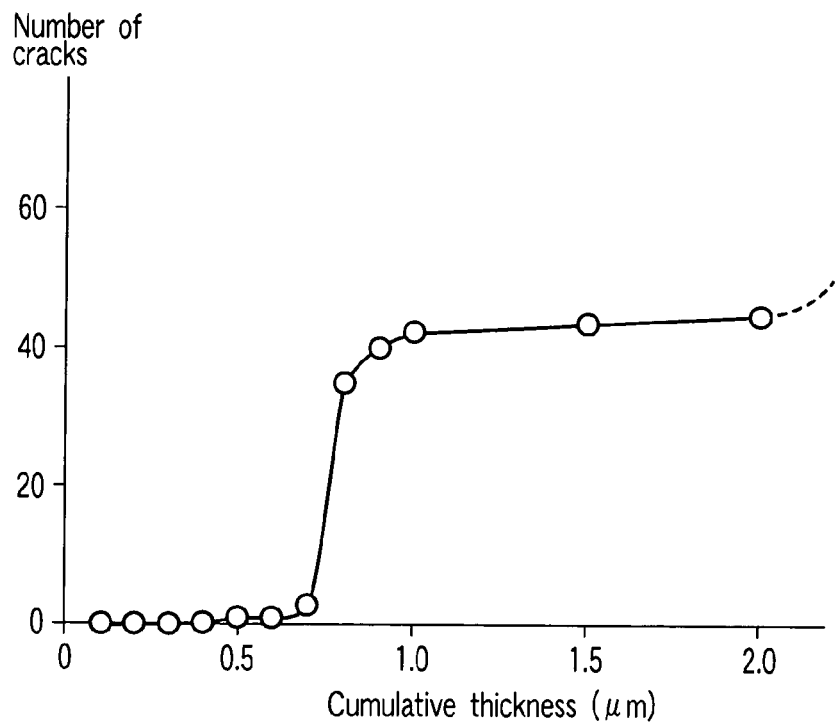
FIG. 7 is a graph showing the relationship between the cumulative film thickness on target substrates and the number of cracks on a by-product film, where a film formation process using DCS and ammonia to form a silicon nitride film having a thickness of 0.1 µm was repeated a plurality of times, under conditions different from those for FIG. 4.

FIG. 7 is a graph showing the relationship between the cumulative film thickness on target substrates and the number of cracks on a by-product film, where a film formation process using the conditions of Experiment 3 to form a silicon nitride film having a thickness of 0.1 μm was repeated a plurality of times. As shown in FIG. 7, also in this case, where the cumulative film thickness was 0.7 μm or less, cracks were scarcely generated, although conditions different from the former case were used in terms of process temperature, process pressure, and process gas flow rate. On the other hand, where the cumulative film thickness exceeded 0.7 µm, a lot of cracks were generated. From these results, it has been found that, where DCS and ammonia are used to form a silicon nitride film, the threshold of the cumulative film thickness should be set at 0.7 µm, regardless of the preset process temperature, process pressure, and process gas flow rate.

EXPERIMENT 4

In order to find the threshold of the cumulative film thickness, for a film formation process using a different film formation gas, a process was performed under the following conditions. In Experiment 4, the film formation process employed hexachlorodisilane (HCD) and ammonia to form a silicon nitride film. Specifically, while the interior of the reaction tube 2 was set at 600° C. and 40 Pa (0.3 Torr), HCD set at 0.01 liters/min and ammonia set at 2 liters/min were supplied, to form a silicon nitride film on semiconductor wafers W.

Figure 8:
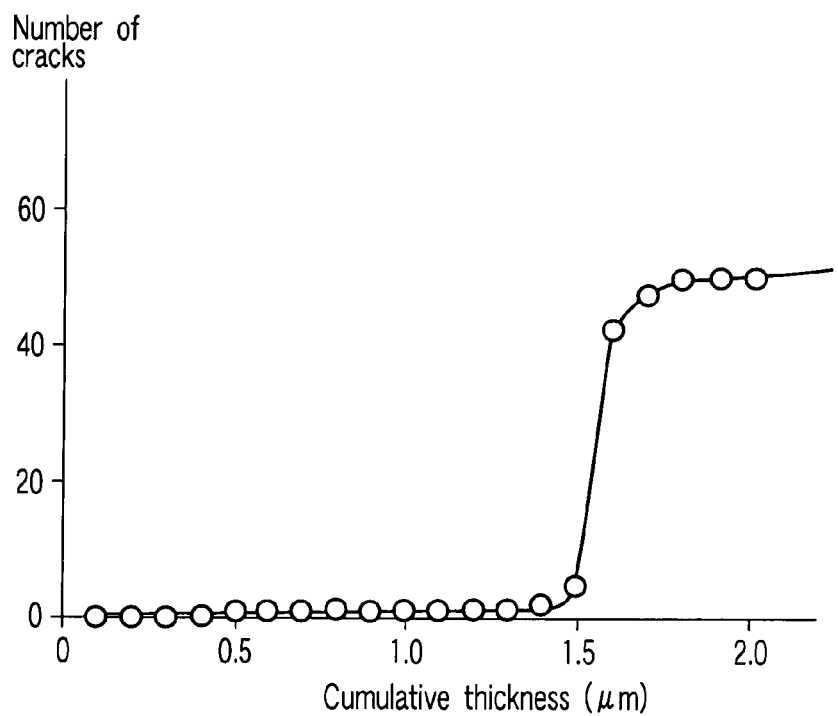
FIG. 8 is a graph showing the relationship between the cumulative film thickness on target substrates and the number of cracks on a by-product film, where a film formation process using HCD and ammonia to form a silicon nitride film having a thickness of 0.1 µm was repeated a plurality of times.

FIG. 8 is a graph showing the relationship between the cumulative film thickness on target substrates and the number of cracks on a by-product film, where a film formation process using the conditions of Experiment 4 to form a silicon nitride film having a thickness of 0.1 µm was repeated a plurality of times. As shown in FIG. 8, where the cumulative film thickness was 1.5 µm or less, cracks were scarcely generated. On the other hand, where the cumulative film thickness exceeded 1.5 µm, a lot of cracks were generated. From these results, it has been found that, where HCD and ammonia are used to form a silicon nitride film, the threshold of the cumulative film thickness should be set at 1.5 µm.

EXPERIMENT 5

In order to find the threshold of the cumulative film thickness, for a film formation process using a further different film formation gas, a process was performed under the following conditions. In Experiment 5, the film formation process employed mono-silane to form a poly-crystalline silicon film. Specifically, while the interior of the reaction tube 2 was set at 620° C. and 26.6 Pa (0.2 Torr), mono-silane set at 0.4 liters/min was supplied, to form a poly-crystalline silicon film on semiconductor wafers W.

Figure 9:
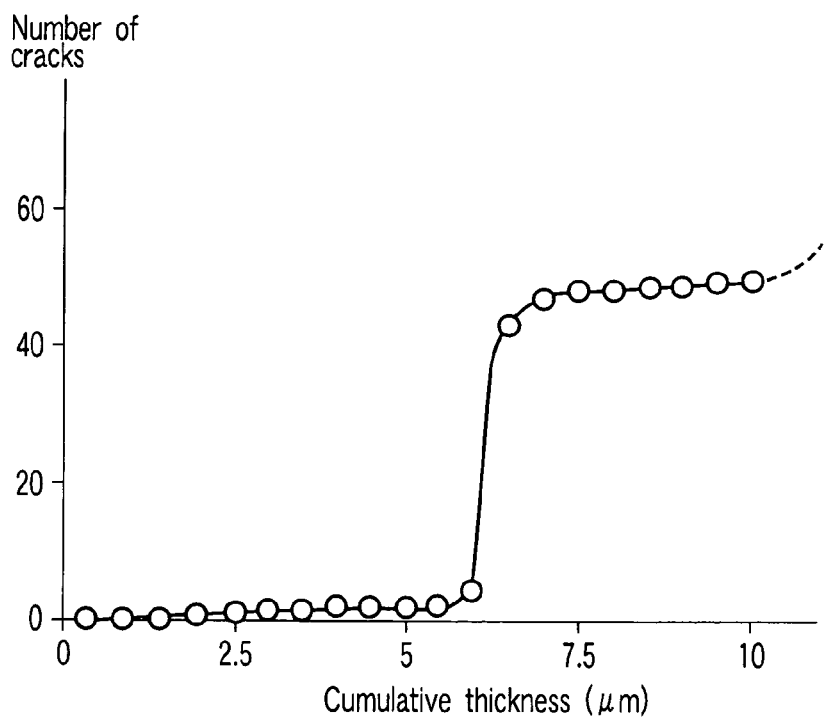
FIG. 9 is a graph showing the relationship between the cumulative film thickness on target substrates and the number of cracks on a by-product film, where a film formation process using mono-silane to form a poly-crystalline silicon film having a thickness of 0.5 µm was repeated a plurality of times.

FIG. 9 is a graph showing the relationship between the cumulative film thickness on target substrates and the number of cracks on a by-product film, where a film formation process using the conditions of Experiment 5 to form a poly-crystalline silicon film having a thickness of 0.5 µm was repeated a plurality of times. As shown in FIG. 9, where the cumulative film thickness was 6 µm or less, cracks were scarcely generated. On the other hand, where the cumulative film thickness exceeded 6 µm, a lot of cracks were generated. From these results, it has been found that, where mono-silane is used to form a poly-crystalline silicon film, the threshold of the cumulative film thickness should be set at 6 µm.

<Consequence and modification>

As described above, according to the embodiments described above, a method for using a film formation apparatus for a semiconductor process is arranged as follows. Specifically, at first, the process conditions of a film formation process are determined to form a thin film on a target substrate (semiconductor wafers W) accommodated in a reaction chamber (reaction tube 2) of a film formation apparatus (heat processing apparatus 1). The process conditions include a preset film thickness of the thin film (for example, a silicon nitride film or poly-crystalline silicon film) to be formed on the target substrate. Then, the timing of performing a cleaning process is determined, in accordance with the process conditions, to remove a by-product film deposited on an inner surface of the reaction chamber due to the film formation process. The timing is defined by a threshold concerning a cumulative film thickness that is a value obtained by multiplying the number of repetitions of the film formation process by the preset film thickness.

For example, it is assumed that the cumulative film thickness does not exceed the threshold where the film formation process is repeated N times (N is a positive integer and preferably 2 or more), but exceeds the threshold where the film formation process is repeated N+1 times. In this case, the first to Nth processes, each consisting of the film formation process, are preformed continuously without interposing the cleaning process therebetween. Then, the cleaning process is performed after the Nth process and before an (N+1)th process consisting of the film formation process.

For this purpose, the control section (control section 100) of the film formation apparatus recognizes the process conditions of the film formation process selected by, e.g., an operator, and then determines the timing of performing the cleaning process in accordance with the process conditions. In this case, a specific process recipe may be selected from a plurality of process recipes prepared in advance, or a specific process recipe may be formed by adding some values of the process conditions into a basic process recipe. Then, under the control of the control section, the film formation process and cleaning process are performed by the film formation apparatus. Alternatively, the timing of performing the cleaning process may be determined by an operator and input into the control section.

The data necessary for determining the timing of performing the cleaning process may be obtained by performing preliminary experiments, such as those shown in Experiments 1 to 5 described above. For example, the threshold of the cumulative film thickness may be determined in accordance with the relationship between the number of cracks generated on the by-product film and the cumulative film thickness. Alternatively, the threshold of the cumulative film thickness may be determined in accordance with the relationship between the number of particles deposited on the thin film and the cumulative film thickness.

Where the formed thin film is a silicon nitride film, the cleaning gas may be a mixture gas of fluorine, hydrogen fluoride, and nitrogen. On the other hand, where the formed thin film is a poly-crystalline silicon, the cleaning gas is preferably a mixture gas of fluorine and nitrogen. The cleaning gas can be any gas as long as it can remove a by-product film deposited inside the reaction chamber. For example, a gas containing fluorine and/or chlorine, such as $ClF_3$, may be used.

In the embodiment described above, the cleaning gas contains nitrogen gas as a dilution gas. The dilution gas preferably contains a dilution gas, because the process time can be more easily controlled if the gas is so arranged. However, the cleaning gas may contain no dilution gas. The dilution gas consists preferably of an inactive gas, such as nitrogen gas, helium gas (He), neon gas (Ne), or argon gas (Ar).

In the embodiments described above, the reaction tube 2, lid 6, and wafer boat 11 are made of quartz. Alternatively, these members may be made mainly of a material selected from other silicon-containing materials, such as silicon carbide (SiC). Further, the lid 6 may be made of, e.g., stainless steel. Where the reaction tube 2 is made of a silicon-containing material, such as quartz, not only the surface of by-product films is cracked, but also the surface of the reaction tube may be cracked. Accordingly, in order to avoid ill effects on the subsequent film formation process, it may be preferable to perform the cleaning process frequently. In general, one cleaning process is performed after the film formation process is repeated two times or more (i.e., the number N described above is 2 or more). However, there may be a case where a cleaning process is performed every time the film formation process is performed, depending on the process conditions of the film formation process.

In the embodiments described above, the process gas feed lines 17 are disposed in accordance with the type of process steps. Alternatively, for example, a plurality of process gas feed lines 17 may be disposed in accordance with the type of gases (e.g., five lines for fluorine, hydrogen fluoride, DCS, ammonia, and nitrogen). Further, a plurality of process gas feed lines 17 may be connected to the sidewall of the reaction tube 2 near the bottom, to supply each gas through a plurality of lines. In this case, a process gas is supplied through the plurality of process gas feed lines 17 into the reaction tube 2, and thereby more uniformly spreads in the reaction tube 2.

In the embodiments described above, the heat processing apparatus employed is a heat processing apparatus of the batch type having a single-tube structure. However, for example, the present invention may be applied to a vertical heat processing apparatus of the batch type having a reaction tube of the double-tube type, which is formed of inner and outer tubes. Alternatively, the present invention may be applied to a heat processing apparatus of the single-substrate type. The target substrate is not limited to a semiconductor wafer W, and it may be a glass substrate for, e.g., an LCD.

The control section 100 of the heat processing apparatus is not limited to a specific system, and it may be realized by an ordinary computer system. For example, a program for executing the process described above may be installed into a multi-purpose computer, using a recording medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined recording medium, as described above. In this case, for example, a program may be pasted on a bulletin board (BBS) on a communication network, and then supplied through a network while being superimposed on a carrier wave. The program thus provided would then be activated and ran under the control of the OS of the computer, as in the other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a film formation apparatus for a semiconductor process, the method comprising:
   applying process conditions of a film formation process for forming a thin film on a target substrate accommodated in a reaction chamber of the film formation apparatus, the process conditions including a preset film thickness of the thin film to be formed on the target substrate;
   applying a timing of performing a cleaning process for removing a by-product film deposited on an inner surface of the reaction chamber due to the film formation process, in accordance with the process conditions, the timing being defined by a threshold concerning a cumulative film thickness that is a value obtained by multiplying a number of repetitions of the film formation process by the preset film thickness, wherein the cumulative film thickness does not exceed the threshold where the film formation process is repeated N times (N is a positive integer), but exceeds the threshold where the film formation process is repeated N+1 times;
   performing first to Nth processes, each consisting of the film formation process, continuously without interposing the cleaning process therebetween; and
   performing the cleaning process after the Nth process and before an (N+1)th process consisting of the film formation process.

2. The method for using a film formation apparatus according to claim 1, wherein the film formation process is arranged to supply a film formation gas into the reaction chamber, and set an interior of the reaction chamber at a temperature and a pressure to decompose the film formation gas, and the by-product film is derived from the film formation gas.

3. The method for using a film formation apparatus according to claim 2, wherein the film formation gas comprises diehiorosilane and ammonia, the thin film comprises a silicon nitride film, and the threshold is set at 0.7 µm.

4. The method for using a film formation apparatus according to claim 2, wherein the film formation gas comprises hexaehlorodisilane and ammonia, the thin film comprises a silicon nitride film, and the threshold is set at 1.5 µm.

5. The method for using a film formation apparatus according to claim 2, wherein the film formation gas comprises mono-silane, the thin film comprises a poly-crystalline silicon film, and the threshold is set at 6 µm.

6. The method for using a film formation appartus according to claim 1, wherein the cleaning process is arranged to supply a cleaning gas into the reaction chamber, and set an interior of the reaction chamber at a temperature and a pressure to cause the cleaning gas to react with the by-product film.

7. The method for using a film formation apparatus according to claim 6, wherein the thin film comprises a silicon-containing film.

8. The method for using a film formation apparatus according to claim 7, wherein the cleaning gas is a gas containing fluorine or chlorine.

9. The method for using a film formation apparatus according to claim 1, wherein the threshold is determined in accordance with a relationship between a number of cracks generated on the by-product film and the cumulative film thickness.

10. The method for using a film formation apparatus according to claim 1, wherein the threshold is determined in accordance with a relationship between a number of particles deposited on the thin film and the cumulative film thickness.

11. A method for using a film formation apparatus for a semiconductor process, the method comprising:
    applying process conditions of a film formation process for forming a thin film on a target substrate accommodated in a reaction chamber of the film formation apparatus, the process conditions including a preset film thickness of the thin film to be formed on the target substrate;
    applying a timing of performing a cleaning process for removing a by-product film deposited on an inner surface of the reaction chamber due to the film formation process, in accordance with the process conditions, the timing being defined by a threshold concerning a cumulative film thickness that is a value obtained by multiplying a number of repetitions of the film formation process by the preset film thickness, wherein the cumulative film thickness does not exceed the threshold where the film formation process is repeated N times (N is a positive integer), but exceeds the threshold where the film formation process is repeated N+1 times;

performing first to Nth processes, each consisting of the film formation process, continuously without interposing the cleaning process therebetween, while applying the process conditions to the first to Nth processes; and performing the cleaning process by applying the timing thereto after the Nth process and before an (N+1)th process consisting of the film formation process.

12. The method for using a film formation apparatus according to claim 11, wherein the film formation process is arranged to supply a film formation gas into the reaction chamber, and set an interior of the reaction chamber at a temperature and a pressure to decompose the film formation gas, and the by-product film is derived from the film formation gas.

13. The method for using a film formation apparatus according to claim 12, wherein the film formation gas comprises dichlorosilane and ammonia, the thin film comprises a silicon nitride film, and the threshold is set at 0.7 μm.

14. The method for using a film formation apparatus according to claim 12, wherein the film formation gas comprises hexachlorodisilane and ammonia, the thin film comprises a silicon nitride film, and the threshold is set at 1.5 μm.

15. The method for using a film formation apparatus according to claim 12, wherein the film formation gas comprises mono-silane, the thin film comprises a poly-crystalline silicon film, and the threshold is set at 6 μm.

16. The method for using a film formation apparatus according to claim 11, wherein the cleaning process is arranged to supply a cleaning gas into the reaction chamber, and set an interior of the reaction chamber at a temperature and a pressure to cause the cleaning gas to react with the by-product film.

17. The method for using a film formation apparatus according to claim 16, wherein the thin film comprises a silicon-containing film.

18. The method for using a film formation apparatus according to claim 17, wherein the cleaning gas is a gas containing fluorine or chlorine.

19. The method for using a film formation apparatus according to claim 11, wherein the threshold is determined in accordance with a relationship between a number of cracks generated on the by-product film and the cumulative film thickness.

20. The method for using a film formation apparatus according to claim 11, wherein the threshold is determined in accordance with a relationship between a number of particles deposited on the thin film and the cumulative film thickness.

* * * * *